United States Patent
Green et al.

(10) Patent No.: US 7,253,455 B2
(45) Date of Patent: Aug. 7, 2007

(54) PHEMT WITH BARRIER OPTIMIZED FOR LOW TEMPERATURE OPERATION

(75) Inventors: Bruce M. Green, Gilbert, AZ (US);
Olin L. Hartin, Chandler, AZ (US);
Ellen Y. Lan, Chandler, AZ (US);
Philip H. Li, Scottsdale, AZ (US);
Monte G. Miller, Phoenix, AZ (US);
Matthias Passlack, Chandler, AZ (US);
Marcus R. Ray, Tempe, AZ (US);
Charles E. Weitzel, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 214 days.

(21) Appl. No.: 11/100,095

(22) Filed: Apr. 5, 2005

(65) Prior Publication Data

US 2006/0220062 A1   Oct. 5, 2006

(51) Int. Cl.
*H01L 31/0328* (2006.01)
*H01L 31/0336* (2006.01)
*H01L 31/072* (2006.01)
*H01L 29/06* (2006.01)

(52) U.S. Cl. .................. 257/194; 257/20; 257/24; 257/192

(58) Field of Classification Search ............. 257/194, 257/192, 20, 24
See application file for complete search history.

(56) References Cited

U.S. PATENT DOCUMENTS

| | | | |
|---|---|---|---|
| 4,695,857 A | | 9/1987 | Baba et al. |
| 4,833,508 A | | 5/1989 | Ishikawa et al. |
| 5,262,660 A | * | 11/1993 | Streit et al. ................. 257/194 |
| 5,488,237 A | * | 1/1996 | Kuwata ...................... 257/194 |
| 5,668,387 A | * | 9/1997 | Streit et al. ................. 257/192 |
| 6,316,820 B1 | * | 11/2001 | Schmitz et al. ............. 257/649 |
| 6,703,638 B2 | * | 3/2004 | Danzilio ...................... 257/12 |
| 6,967,360 B2 | * | 11/2005 | Anda et al. ................. 257/190 |

OTHER PUBLICATIONS

Ishikawa et al., "DX-Center-Free GaAs/N-AlGaAs HEMT Structures," Fujitsu Sci. Tech. J. vol. 24, No. 2, Jun. 1988, pp. 143-149.
Baba et al., "Elimination of a DX-center by an AlAs/n-GaAs Superlattice and its Application to 2DEGFETs," Microelectronic Engineering, vol. 4, 1986, pp. 195-206.

* cited by examiner

*Primary Examiner*—Shouxiang Hu
(74) *Attorney, Agent, or Firm*—Ingrassia Fisher Lorenz (57) ABSTRACT

In one embodiment, a semiconductor device (500) includes a buffer layer (504) formed over a substrate (502). An $Al_xGa_{1-x}As$ layer (506) is formed over the buffer layer (504) and has a first doped region (508) formed therein. An $In_xGa_{1-x}As$ channel layer (512) is formed over the $Al_xGa_{1-x}As$ layer (506). An $Al_xGa_{1-x}As$ layer (518) is formed over the $In_xGa_{1-x}As$ channel layer (512), and the $Al_xGa_{1-x}As$ layer (518) has a second doped region formed therein. A GaAs layer (520) having a first recess is formed over the $Al_xGa_{1-x}As$ layer (518). A control electrode (526) is formed over the $Al_xGa_{1-x}As$ layer (518). A doped GaAs layer (524) is formed over the undoped GaAs layer (520) and on opposite sides of the control electrode (526) and provides first and second current electrodes. When used to amplify a digital modulation signal, the semiconductor device (500) maintains linear operation over a wide temperature range.

13 Claims, 6 Drawing Sheets

PHEMT WITH BARRIER OPTIMIZED FOR LOW TEMPERATURE OPERATION

FIELD OF THE INVENTION

The present invention relates to pHEMT devices. More particularly the invention relates to doping in GaAs layers of pHEMT devices to provide a temperature-stable response.

BACKGROUND OF THE INVENTION

The present invention finds application in the field of radio frequency power amplifiers, and more particularly to power amplifiers used in base stations under digital spread spectrum modulation and in a pHEMT device for power amplifier operation over wide temperature range.

One example of spread-spectrum technology includes Wideband Code Division Multiple Access (WCDMA). WCDMA spreads multiple conversations across a wide segment of the spectrum as opposed to splitting a channel into time slots. With WCDMA, unique digital codes are used to differentiate subscribers that are simultaneously using the same spectrum.

In order to isolate conversations between two adjacent channels, a power amplifier used for WCDMA requires a certain level of linearity, characterized by an output power and an associated adjacent-channel power ratio (ACPR). As an example, an output power on the order of 30 dBm with an associated ACPR on the order of −45 dBc (decibels with respect to the carrier) is specified as the power and linearity requirement for the active device in a power amplifier. Linear RF power amplifier manufacturers can utilize such a device having an ACPR at or below −45 dBc. The exact degree of power and linearity depends on the application and can vary widely.

In addition, base stations that utilize such a power amplifier are installed across the world and must be capable of operating over a wide range of temperatures to provide a desired level of service coverage. Accordingly, the RF power amplifier circuit should maintain performance over a temperature range in the order of −40° C. to +90° C. at its mounting base plate. Only minimal performance degradation is allowed at the extreme temperature specifications.

In radio frequency base station power amplifier operations, silicon LDMOS technology typically is used when the frequency is below 2.5 GHz. However, silicon (Si) LDMOS has insufficient efficiency to meet competitive requirements above 2.5 GHz. Therefore, semiconductor technologies, such as GaAs (or AlGaAs) and GaN have been proposed and increasingly adopted. Typically, these are Metal Semiconductor Field Effect Transistors (MESFET) or High Electron Mobility Transistors (HEMT) including pseudomorphic High Electron Mobility Transistors (pHEMT).

When an AlGaAs pHEMT device is used for a power amplifier under digital spread spectrum modulation stimulus at −40° C., ACPR can degrade dramatically, as compared to room temperature. This level of linearity degradation phenomenon occurs under digital modulation, such as W-CDMA on the order of from 2 dB to 10 dB. It would be desired to obtain a device that does not degrade at this temperature range. Further, it would be desired to maintain performance of the pHEMT device at higher temperatures.

Accordingly, it would be desirable to provide for reduced power degradation under digital modulation over wide temperature operation for overcoming the problems in the pHEMT art. It would further be advantageous if the new pHEMT was compatible with existing manufacturing processes and materials used in semiconductor manufacturing. The present invention addresses one or more of these needs.

BRIEF DESCRIPTION OF THE DRAWINGS

The present invention will hereinafter be described in conjunction with the following drawing figures, wherein like numerals denote like elements, and wherein.

DETAILED DESCRIPTION OF A PREFERRED EMBODIMENT

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
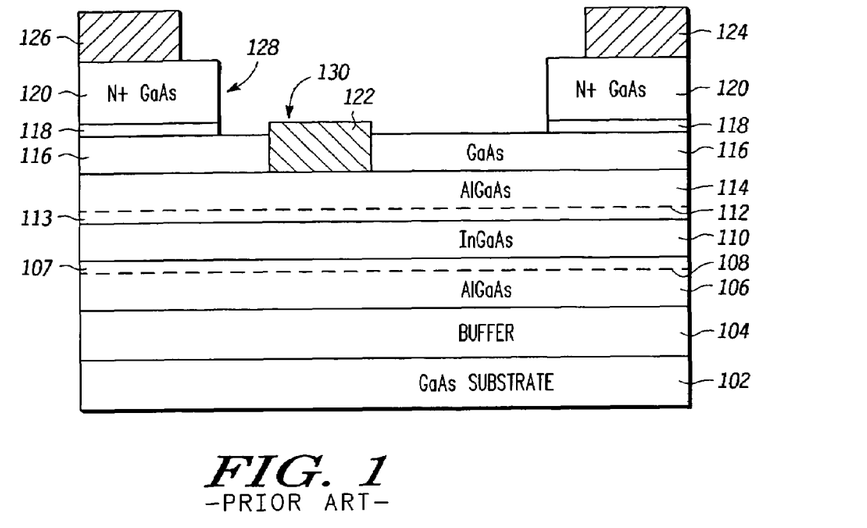
FIG. 1 is a cross-sectional view of an AlGaAs/InGaAs pHEMT device known in the art.

FIG. 1 is a cross-sectional view of an AlGaAs/InGaAs pHEMT device known in the art. The pHEMT device 100 is a double heterojunction structure that includes a GaAs substrate 102, a buffer layer 104, an initial portion of an AlGaAs layer 106, lower doping monolayer 108, a remaining portion of AlGaAs layer 107, InGaAs channel layer 110, an initial portion of an AlGaAs layer 113, upper doping monolayer 112, a remaining portion of AlGaAs layer 114, a GaAs layer 116, etch stop 118, and N+ GaAs ohmic contact regions 120. The pHEMT device 100 further includes metal electrodes 122, 124, and 126. Still further, pHEMT device 100 includes a dual recessed pHEMT device, wherein the first recess is generally indicated by reference numeral 128 and a second recess generally indicated by reference numeral 130. The configuration of the pHEMT device is asymmetrical as between the source electrode 126 and gate electrode 122 and the drain electrode 124 and gate electrode 122. In the device 100 of FIG. 1, AlGaAs is used as a barrier layer material. $Al_{0.24}Ga_{0.76}As$ is lattice matched to the underlying GaAs substrate 102.

Figure 2:
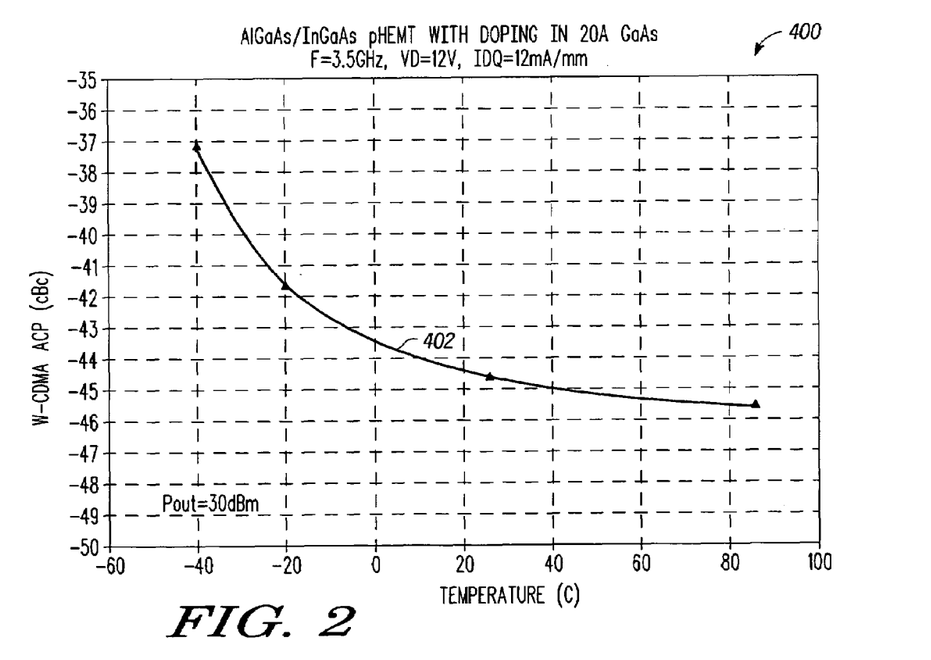
FIG. 2 is a graphical view of W-CDMA adjacent channel power ratio (ACPR) versus baseplate temperature for the device of FIG. 1 at an output power level of 30 dBm.

FIG. 2 is a graphical view 400 of a W-CDMA adjacent channel power ratio (ACPR) versus temperature of the AlGaAs/InGaAs pHEMT device 100 of FIG. 1 under 12 V drain supply voltage. The device 100 operated at an output power of 30 dBm results in the ACPR vs. temperature characteristic as illustrated by curve 402. For a given power requirement (e.g., 30 dBm), a substantially higher ACPR is observed at low temperatures as compared with that at 25 C. In other words, curve 402 shifts upwards at temperatures below 25 C, resulting in a substantial ACPR degradation in order to maintain the desired output power requirement. Furthermore, a substantial linearity degradation includes anything on the order of more than 2 dB. As shown in FIG. 2, the linearity degradation illustrated by the difference between 25 C and −40 C is approximately 7.5 dB at the power requirement of 30 dBm.

Figure 3:
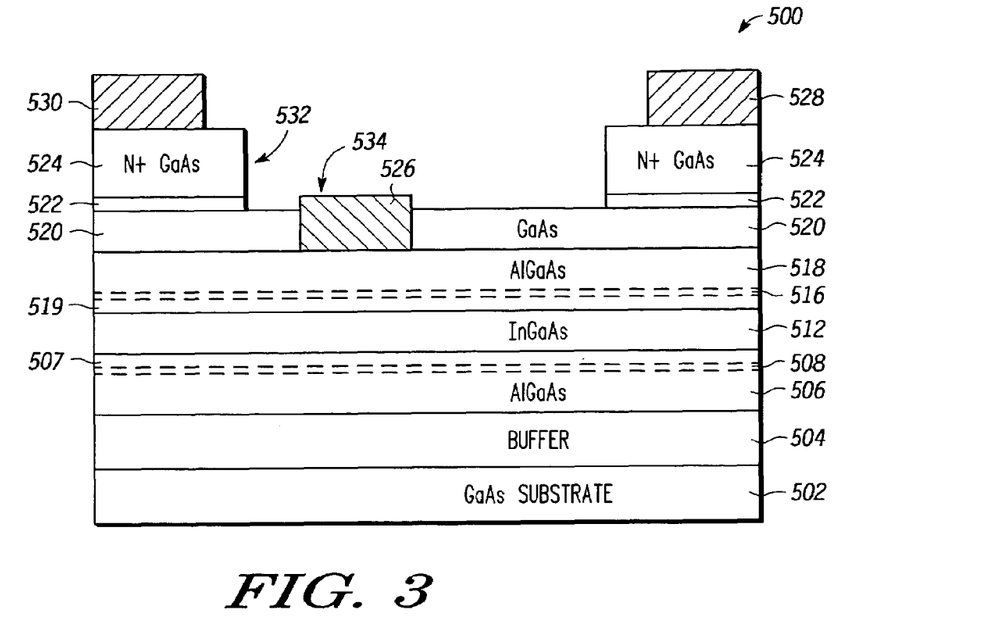
FIG. 3 is a cross-sectional view of an AlGaAs/InGaAs pHEMT device according to one embodiment of the present disclosure.

FIG. 3 is a cross-sectional view of a modifed AlGaAs/InGaAs pHEMT device according to one embodiment of the present disclosure. The pHEMT device 500 is a double heterojunction structure that includes a GaAs substrate 502, a buffer layer 504, an initial portion of an AlGaAs layer 506, lower doping layer 508, a remaining portion of AlGaAs layer 507, an InGaAs channel layer 512, an initial portion of an AlGaAs barrier layer 519, upper doping layer 516, a remaining portion of AlGaAs barrier layer 518, a GaAs layer 520, etch stop 522, and N+ GaAs ohmic contact regions 524. The pHEMT device 500 further includes metal electrodes 526, 528, and 530. Still further, pHEMT device 500 includes a dual recessed pHEMT device, wherein the first recess is generally indicated by reference numeral 532 and a second recess generally indicated by reference numeral 534. The configuration of the pHEMT device is also asymmetrical as between the source 530 and gate 526 electrodes and the drain 528 and gate 526 electrodes.

Figure 4:
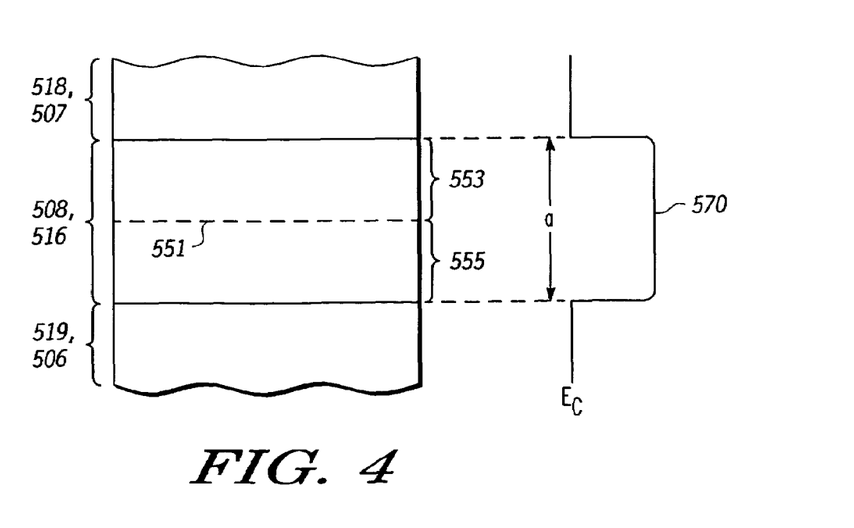
FIG. 4 is a side view of a first and second doped region in an AlGaAs layer, according to one embodiment of the present disclosure.

Lower doping layer 508 and upper doping layer 516 are themselves composite layers. In one embodiment, shown in FIG. 4, each doping layer 508, 516 comprises a layer of silicon atoms 551 disposed between upper 553 and lower 555 layers of GaAs. Preferably the silicon layer 551 comprises a sheet that is one atom thick. Thus, doping layers 508, 516 may be described as a "sandwich" of a silicon monolayer 551 between GaAs layers. The GaAs layers surrounding the silicon doping layer forms a quantum well 570 within the wider bandgap AlGaAs layer. The thickness of the GaAs layers requires consideration of the fact that it is necessary for the GaAs layer to contain the large majority of dopant atoms which tend to diffuse during high temperature process steps. However, since the GaAs layers within the wider bandgap AlGaAs layers create a quantum well 570 shown in FIG. 4, further considerations must be given in order to prevent bound electron states from occupying the quantum well and thus causing an overall reduction in the device's channel mobility due to the high effective mass of the AlGaAs or GaAs compared to the InGaAs channel of the device. Based on these considerations, it has been determined from simulation and experiment that the width of the quantum well must be less than a width on the order of 25 Å to avoid performance degradation. As a consequence, each layer 553, 555 of GaAs are several atomic layers in thickness such that the total thickness of doping layer 508, 516 is less than 25 Å in one embodiment. FIG. 4 indicates upper GaAs layer 553 and lower GaAs layer 555 each with three atomic layers; other thicknesses are possible. In other embodiments, the doping layer 508, 516 may be up to approximately 40 Å in total thickness. In still other embodiments, doping layer 516 may be used in conjunction with doping layer 508 either omitted or used in a form with GaAs layers 553 and 555 omitted (not shown). Likewise in other embodiments, doping layer 508 may be used in conjunction with doping layer 516 either omitted or used in a form with GaAs layers 553 and 555 omitted (not shown). From the foregoing discussion, it should be appreciated that the materials 553, 555 used to encase the doping 551 can comprise InGaP or any other material that is not susceptible to deep level trapping (e.g. DX centers) such as AlGaAs. Furthermore, it should be appreciated that the concept of dopant layers encased in non-aluminum containing materials (e.g. AlGaAs) can be applied to other material systems such as Indium Aluminum Arsenide/Indium Gallium Arsenide (AlInAs/InGaAs) or Aluminum Gallium Nitride/Gallium Nitride (AlGaN/GaN), or any other material system where it is desired to avoid the effect of deep levels arising from placing doping in layers containing aluminum alloys.

A pHEMT device such as illustrated in FIG. 3 is fabricated using known processing techniques. For example, layers 502 through 524 may be formed through deposition procedures such as molecular beam epitaxy or metal-organic chemical vapor deposition. As is known in the art, concentration levels of dopants and materials can be controlled through shuttering or otherwise limiting the deposition of selected materials. Apertures and recesses may be formed through masking and etching techniques.

Figure 5:
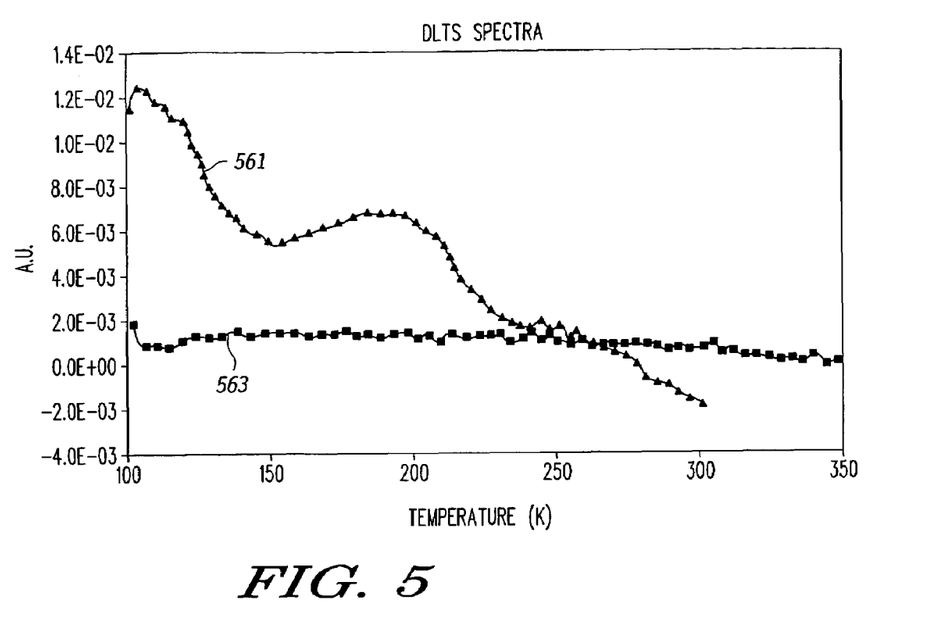
FIG. 5 is a graph displaying capacitance DLTS spectra as a function of temperature of the device of FIG. 3, according to one embodiment of the present disclosure.

Referring now to FIG. 5 there is shown a graph of capacitance Deep Level Transient Spectoscopy (DLTS) spectra in arbitrary units as a function of temperature (° K). As is known in the art, capacitance DLTS is a measurement of trap or deep level activity in a structure that comes by analyzing small transients in the device capacitance as function of temperature. The DLTS data in FIG. 5 were developed with respect to a −2V reverse bias and a 1 ms filling pulse to 0V. The top curve 561 in FIG. 5 represents the capacitance DLTS spectra according to the device of FIG. 1. As shown in curve 561 of FIG. 5 the device of FIG. 1 shows a DLTS plot has peaks indicative of deep-level activity. Indeed, the curve 561 shows evidence of capactive transients due to deep levels at 233K (−40 C). The lower curve 563 represents the capacitance DLTS plot according to the device of FIG. 3. The lower curve 563 shows a DLTS response without peaks, over a temperature range, as compared to the upper curve 561. Further, the lower curve 563 shows a set of DLTS data that has no substantial peaks due to deep levels at both low temperatures and high temperatures. Activity associated with deep levels as seen from DLTS has implications for digitally modulated signals which again presents a series of random pulses on an RF carrier to the device used in a power amplifier. Transient capacitance due to deep levels in the device introduce distortion and "memory" effects that have the effect of degrading ACPR and linearity at temperatures below 25 C.

Figure 6:
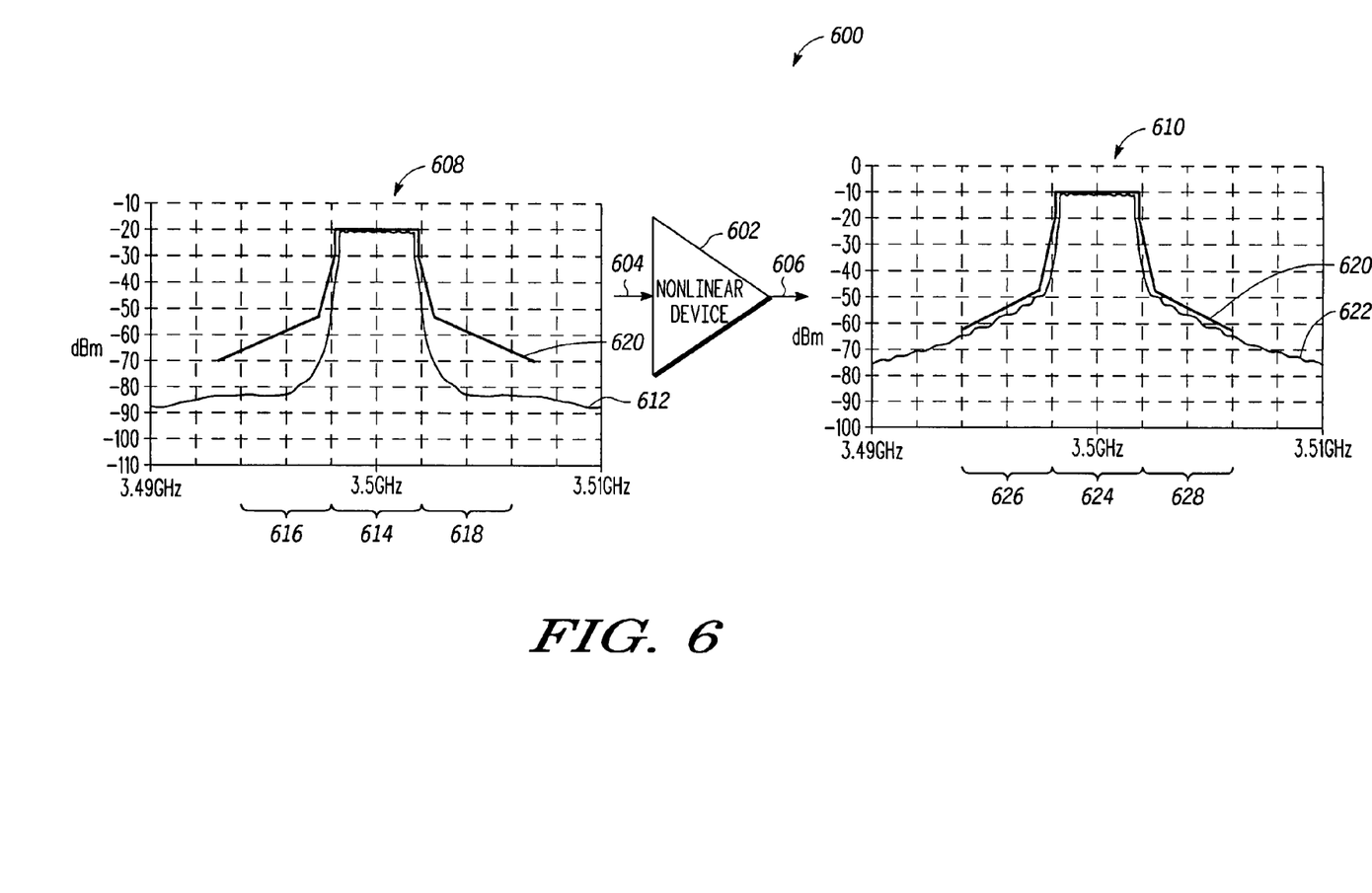
FIG. 6 is a graphical representation of digital modulation signal operation of a power amplifier that includes an AlGaAs/InGaAs pHEMT device according to one embodiment of the present disclosure.

FIG. 6 is a graphical representation 600 of digital modulation signal operation of a power amplifier 602 that includes an AlGaAs/InGaAs pHEMT device 500 according to one embodiment of the present disclosure. Power amplifier 602 includes an input 604 and an output 606. One example of an input signal spectrum with a 3.5 GHz center frequency and a 3.84 MHz bandwidth is provided by the graphical representation indicated by reference numeral 608. In addition, one example of an output signal spectrum is provided by the graphical representation indicated by reference numeral 610.

Referring now to the spectrum 608, an actual input signal spectrum 612 includes portions in a main frequency channel 614, a lower adjacent frequency channel 616, and an upper adjacent frequency channel 618. In this instance, the power level of the input signal in an adjacent channel (616,618) is on the order of −60 dB below the power level in the main channel (614), corresponding to a −60 dBc adjacent channel power ratio (ACPR).

Referring now to the spectrum 610, an actual output signal spectrum 622 includes portions in a main frequency channel 624, a lower adjacent frequency channel 626, and an upper adjacent frequency channel 628. In this instance, the power level of the output signal in an adjacent channel (626,628) is on the order of −45 dB below the power level in the main channel (624), corresponding to a −45 dBc adjacent channel power ratio (ACPR).

In both spectrums 608 and 610, a spectrum mask 620 is shown. Spectrum mask 620 represents the ACPR specification that the output signal spectrum should remain below in order for the power amplifier 602 to be in compliance with the ACPR specification.

Figure 7:
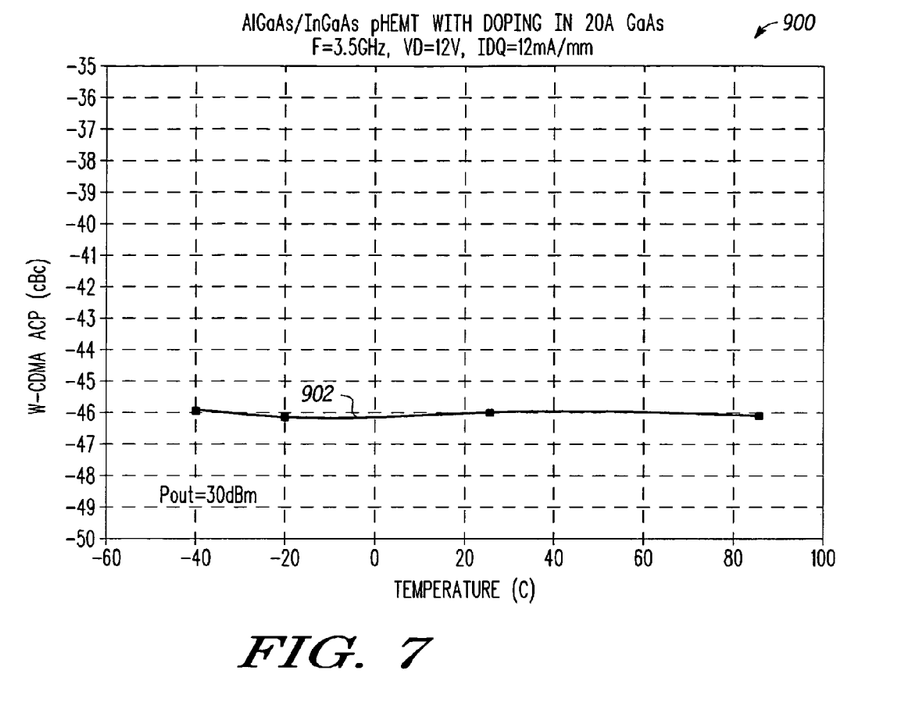
FIG. 7 is a graphical view of W-CDMA adjacent channel power ratio (ACPR) versus baseplate temperature for the device of FIG. 3 at an output power level of 30 dBm according to an embodiment of the present disclosure.

FIG. 7 is a graphical view 900 of a W-CDMA adjacent channel power ratio (ACPR) versus temperature of the AlGaAs/InGaAs pHEMT device 500 of FIG. 3 under 12 V drain supply voltage. The device 500 operated at an output power of 30 dBm results in the ACPR characteristic as illustrated by curve 902. For a given power requirement (e.g., 30 dBm), essentially the same ACPR is observed at low temperatures (below 25 C) as compared with that at 25 C. In other words, curve 902 remains constant with temperature, resulting in a no appreciable ACPR degradation while maintaining the desired output power requirement. As a result, device 500 demonstrates a capability to operate over a wide temperature range and maintain an ACPR for a given power requirement.

Figure 8:
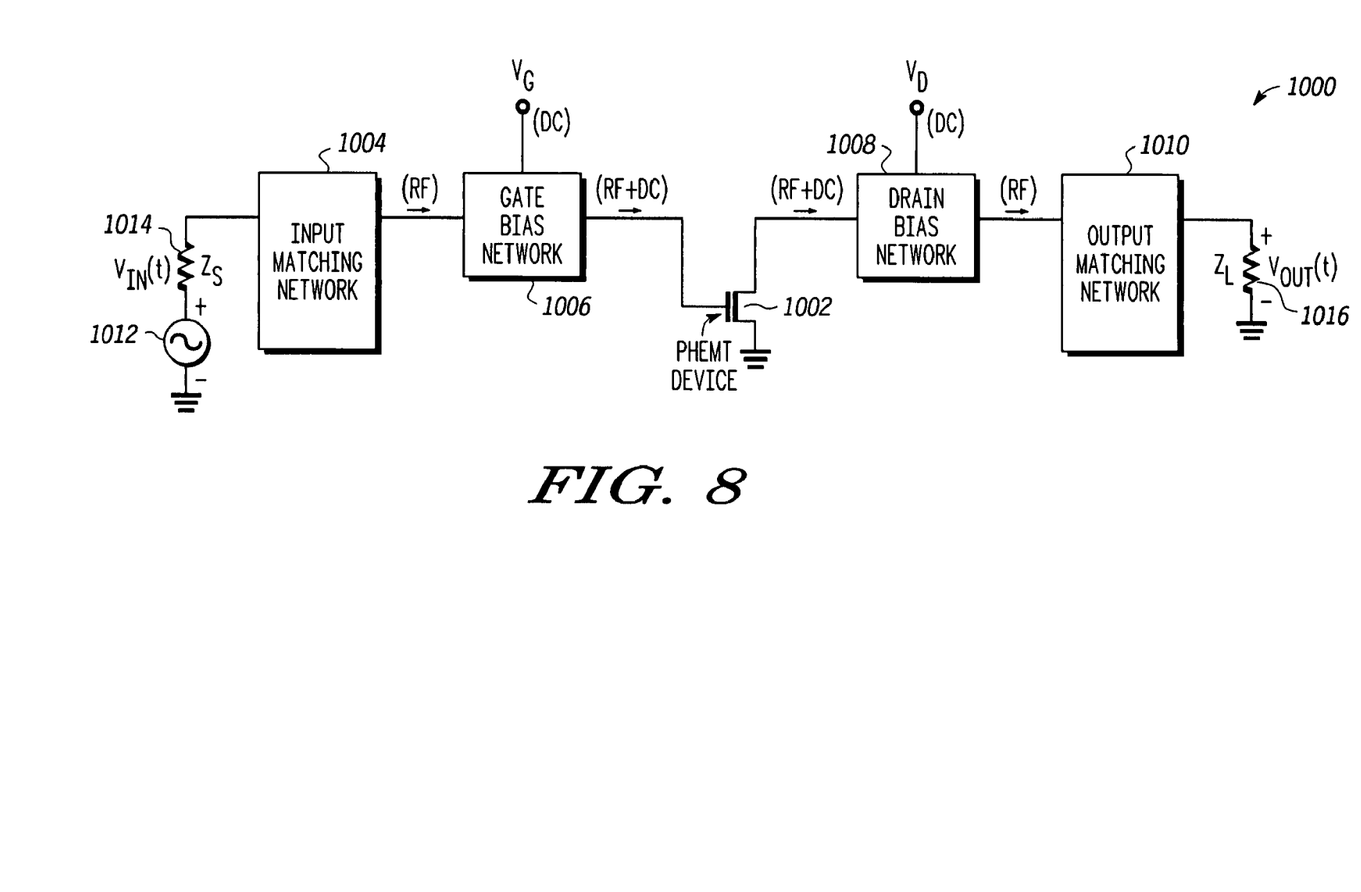
FIG. 8 is a schematic diagram view of a power amplifier including the device of FIG. 3 according to an embodiment of the present disclosure.

FIG. 8 is a schematic diagram view of a power amplifier including the device of FIG. 3 according to an embodiment of the present disclosure. In particular, power amplifier 1000 includes AlGaAs/InGaAs pHEMT device 1002, input matching network 1004, gate bias network 1006, drain bias network 1008, and output matching network 1010. A radio frequency (RF) voltage source input $V_{IN}(t)$, that provides a modulated signal and is indicated by reference numeral 1012, couples to the input matching network 1004 via a source impedance $Z_S$ indicated by reference numeral 1014. Input matching network 1004 outputs an RF signal, which is input to gate bias network 1006. Gate bias network 1006 includes a DC input, supplied by gate voltage supply $V_G$. Responsive to the RF signal and DC inputs, gate bias network 1006 outputs an RF+DC output signal that is applied to the gate of pHEMT device 1002. The source terminal of pHEMT device 1002 is coupled to ground potential. The drain terminal of pHEMT device 1002, which carries an RF+DC signal, is coupled to an input of drain bias network 1008. Drain bias network 1008 includes a DC input, supplied by drain voltage supply $V_D$. Responsive to the RF+DC and DC inputs, drain bias network 1008 outputs an RF output signal that is applied to the output matching network 1010. Output matching network 1010 outputs a $V_{OUT}(t)$ signal across a load 1016 having an impedance $Z_L$.

According to one embodiment a semiconductor device includes a substrate; a buffer layer formed over the substrate; a bottom layer comprising $Al_xGa_{1-x}As$ formed over the buffer layer, the bottom layer having a first doped region formed therein, wherein the first doped region comprises a layer of GaAs, a layer of Si, and a layer of GaAs; an $In_xGa_{1-x}As$ layer formed over the bottom layer; an $Al_xGa_{1-x}As$ layer formed over the $In_xGa_{1-x}As$ layer, the $Al_xGa_{1-x}As$ layer having a second doped region formed therein, wherein the second doped region comprises a layer of GaAs, a layer of Si, and a layer of GaAs; an undoped GaAs layer formed over the $Al_xGa_{1-x}As$ layer, the undoped GaAs layer having a first recess formed therein that exposes a portion of the $Al_xGa_{1-x}As$ layer; a doped GaAs layer formed over the GaAs layer, the doped GaAs layer having a second recess therein that exposes a portion of the undoped GaAs layer; a control electrode having opposite ends formed within the first recess of the undoped GaAs layer and within the second recess of the doped GaAs layer; and first and second current electrodes disposed on the doped GaAs layer proximate opposite ends of the control electrode such that the doped GaAs layer provides current through the first and second current electrodes for the semiconductor device.

In another embodiment the first doped region and the second doped region include a first layer of GaAs, a monolayer of Si disposed over the first layer of GaAs, and a second layer of GaAs disposed over the monolayer of Si, wherein each region is less than approximately 40 Å in thickness.

In another embodiment, the first and the second doped regions have a thickness less than approximately 25 Å.

In another embodiment, the GaAs substrate is a semi-insulating substrate.

In another embodiment, the semiconductor device further includes an etch stop layer between the undoped GaAs layer and the doped GaAs layer, wherein the etch stop layer comprises one selected from the group consisting of AlAs and $In_xGa_{1-x}P$.

In another embodiment the control electrode comprises one selected from the group consisting of titanium tungsten nitride (TiWN) and tungsten silicide (WSi).

In another embodiment, the semiconductor device further includes first and second metal source/drain contacts formed on the first and second current electrodes, respectively.

In another embodiment, the control electrode is asymmetrically positioned between the first and second current electrodes.

According to an additional embodiment, a method for forming a semiconductor device includes the steps of providing a substrate; forming a buffer layer over the substrate; forming a bottom layer, comprising $Al_xGa_{1-x}As$, over the buffer layer, the bottom layer having a first doped region formed therein, wherein the first doped region comprises a first layer of GaAs, a monolayer of Si formed over the first layer of GaAs, and a second layer of GaAs formed over the monolayer of Si, wherein the first doped region is less than approximately 40 Å in thickness; forming an $In_xGa_{1-x}As$ channel layer over the bottom layer; forming an $Al_xGa_{1-x}As$ layer over the $In_xGa_{1-x}As$ layer, the $Al_xGa_{1-x}As$ layer having a second doped region formed therein, wherein the second doped region comprises a first layer of GaAs, a monolayer of Si formed over the first layer of GaAs, and a second layer of GaAs formed over the monolayer of Si, wherein the second doped region is less than approximately 40 Å in thickness; forming an undoped GaAs layer over the $Al_xGa_{1-x}As$ layer, the GaAs layer having a first recess formed therein that exposes a portion of the $Al_xGa_{1-x}As$ layer; forming a doped GaAs layer formed over the GaAs layer, the doped GaAs layer having a second recess therein that exposes a portion of the undoped GaAs layer; forming a control electrode having opposite ends within the first recess of the undoped GaAs layer and within the second recess of the doped GaAs layer; and forming first and second current electrodes disposed on the doped GaAs layer proximate opposite ends of the control electrode such that the doped GaAs layer provides current through the first and second current electrodes for the semiconductor device.

In another embodiment the method further includes growing an etch stop layer on the undoped GaAs layer, wherein the etch stop layer comprises one selected from the group consisting of AlAs and $In_xGa_{1-x}P$.

In another embodiment, the control electrode comprises one selected from the group consisting of titanium tungsten nitride (TiWN) and tungsten silicide (WSi).

In another embodiment, the step of forming first and second current electrodes further includes forming first and second metal source/drain contacts on the first and second current electrodes, respectively.

In another embodiment, forming the control electrode further includes asymmetrically positioning the control electrode between the first and second current electrodes.

According to an additional embodiment, an amplifier includes a transistor comprising: a substrate; a buffer layer formed over the substrate; an $Al_xGa_{1-x}As$ layer formed over the buffer layer, the $Al_xGa_{1-x}As$ layer having a first doped region formed therein, wherein the first doped region comprises a layer of GaAs, a layer of Si, and a layer of GaAs; an $In_xGa_{1-x}As$ layer formed over the $Al_xGa_{1-x}As$ layer; an $In_xGa_{1-x}P$ layer formed over the $In_xGa_{1-x}As$ layer, the $In_xGa_{1-x}P$ layer having a second doped region formed therein; an $Al_xGa_{1-x}As$ layer formed over the $In_xGa_{1-x}As$ layer, the $Al_xGa_{1-x}As$ layer having a second doped region formed therein, wherein the second doped region comprises a layer of GaAs, a layer of Si, and a layer of GaAs; an undoped GaAs layer formed over the $Al_xGa_{1-x}As$ layer, the undoped GaAs layer having a first recess formed therein that exposes a portion of the $Al_xGa_{1-x}As$ layer; a doped GaAs layer formed over the GaAs layer, the doped GaAs layer having a second recess therein that exposes a portion of the undoped GaAs layer; a control electrode having opposite ends formed within the first recess of the undoped GaAs layer and within the second recess of the doped GaAs layer; and first and second current electrodes disposed on the doped GaAs layer proximate opposite ends of the control electrode such that the doped GaAs layer provides current through the first and second current electrodes for the semiconductor device; a gate bias network coupled to the control electrode of the transistor; and a drain bias network coupled to the first current electrode.

In another embodiment, the first doped region and the second doped region comprise a first layer of GaAs, a monolayer of Si disposed over the first layer of GaAs, and a second layer of GaAs disposed over the monolayer of Si, and wherein each region is less than approximately 40 Å in thickness.

In another embodiment the gate bias network comprises an input for receiving a digital spread spectrum modulation signal.

In another embodiment the digital spread spectrum modulation signal is a wide-band code division multiple access (WCDMA) signal.

In another embodiment, the transistor further comprises first and second metal source/drain contacts formed on the first and second current electrodes, respectively.

In another embodiment the transistor is a pseudomorphic high electron mobility transistor (pHEMT).

In another embodiment the control electrode is asymmetrically positioned between the first and second current electrodes.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A semiconductor device comprising:
a substrate;
a buffer layer formed over the substrate;
a bottom layer comprising $Al_xGa_{1-x}As$ formed over the buffer layer, the bottom layer having a first doped region formed therein, wherein the first doped region comprises a layer of GaAs, a layer of Si, and a layer of GaAs;
an $In_xGa_{1-x}As$ layer formed over the bottom layer;
an $Al_xGa_{1-x}As$ layer formed over the $In_xGa_{1-x}As$ layer, the $Al_xGa_{1-x}As$ layer having a second doped region formed therein, wherein the second doped region comprises a layer of GaAs, a layer of Si, and a layer of GaAs;
an undoped GaAs layer formed over the $Al_xGa_{1-x}As$ layer, the undoped GaAs layer having a first recess formed therein that exposes a portion of the $Al_xGa_{1-x}As$ layer;
a doped GaAs layer formed over the undoped GaAs layer, the doped GaAs layer having a second recess therein that exposes a portion of the undoped GaAs layer;
a control electrode having opposite ends formed within the first recess of the undoped GaAs layer and within the second recess of the doped GaAs layer; and
first and second current electrodes disposed on the doped GaAs layer proximate opposite ends of the control electrode such that the doped GaAs layer provides current through the first and second current electrodes for the semiconductor device.

2. The semiconductor device of claim 1 wherein the first doped region and the second doped region comprise a first layer of GaAs, a monolayer of Si disposed over the first layer of GaAs, and a second layer of GaAs disposed over the monolayer of Si, and wherein each region is less than approximately 40 Å in thickness.

3. The semiconductor device of claim 2 wherein the first and the second doped regions have a thickness less than approximately 25 Å.

4. The semiconductor device of claim 1, wherein the GaAs substrate is a semi-insulating substrate.

5. The semiconductor device of claim 1, further comprising an etch stop layer between the undoped GaAs layer and the doped GaAs layer, wherein the etch stop layer comprises one selected from the group consisting of AlAs and $In_xGa_{1-x}P$.

6. The semiconductor device of claim 1, wherein the control electrode comprises one selected from the group consisting of titanium tungsten nitride (TiWN) and tungsten silicide (WSi).

7. An amplifier comprising:
a transistor comprising:
a substrate;
a buffer layer formed over the substrate;
an $Al_xGa_{1-x}As$ layer formed over the buffer layer, the $Al_xGa_{1-x}As$ layer having a first doped region formed therein, wherein the first doped region comprises a layer of GaAs, a layer of Si, and a layer of GaAs;
an $In_xGa_{1-x}As$ layer formed over the $Al_xGa_{1-x}As$ layer;
an $Al_xGa_{1-x}As$ layer formed over the $In_xGa_{1-x}As$ layer, the $Al_xGa_{1-x}As$ layer having a second doped region formed therein, wherein the second doped region comprises a layer of GaAs, a layer of Si, and a layer of GaAs;

an undoped GaAs layer formed over the $Al_xGa_{1-x}As$ layer, the undoped GaAs layer having a first recess formed therein that exposes a portion of the $Al_xGa_{1-x}As$ layer;

a doped GaAs layer formed over the undoped GaAs layer, the doped GaAs layer having a second recess therein that exposes a portion of the undoped GaAs layer;

a control electrode having opposite ends formed within the first recess of the undoped GaAs layer and within the second recess of the doped GaAs layer; and first and second current electrodes disposed on the doped GaAs layer proximate opposite ends of the control electrode such that the doped GaAs layer provides current through the first and second current electrodes for the semiconductor device;

a gate bias network coupled to the control electrode of the transistor; and a drain bias network coupled to the first current electrode.

8. The amplifier of claim 7 wherein the first doped region and the second doped region comprise a first layer of GaAs, a monolayer of Si disposed over the first layer of GaAs, and a second layer of GaAs disposed over the monolayer of Si, and wherein each region is less than approximately 40 Å in thickness.

9. The amplifier of claim 7, wherein the gate bias network comprises an input for receiving a digital spread sprectrum modulation signal.

10. The amplifier of claim 7, wherein the digital spread spectrum modulation signal is a wide-band code division multiple access (WCDMA) signal.

11. The amplifier of claim 7, wherein the transistor further comprises first and second metal source/drain contacts formed on the first and second current electrodes, respectively.

12. The amplifier of claim 7, wherein the transistor is a pseudomorphic high electron mobility transistor (pHEMT).

13. The amplifier of claim 7, wherein the control electrode is asymmetrically positioned between the first and second current electrodes.

* * * * *